United States Patent [19]

DiStefano et al.

[11] Patent Number: 5,367,764
[45] Date of Patent: Nov. 29, 1994

[54] METHOD OF MAKING A MULTI-LAYER CIRCUIT ASSEMBLY

[75] Inventors: Thomas H. DiStefano, Bronxville; Scott G. Ehrenberg, Fishkill; Igor Y. Khandros, Peekskill, all of N.Y.

[73] Assignee: Tessera, Inc., Elmsford, N.Y.

[21] Appl. No.: 815,401

[22] Filed: Dec. 31, 1991

[51] Int. Cl.⁵ ............................................. H05K 3/36
[52] U.S. Cl. .......................................... 29/830; 29/852; 156/902; 174/260; 174/262; 439/69
[58] Field of Search .................. 156/901, 902; 29/830, 29/846, 852; 439/69

[56] References Cited

U.S. PATENT DOCUMENTS

| | | |
|---|---|---|
| 3,077,511 | 2/1963 | Bohrer et al. . |
| 3,214,827 | 11/1965 | Phohofsky . |
| 3,316,618 | 5/1967 | Guarracini . |
| 3,316,619 | 5/1967 | Beelitz .................. 174/260 X |
| 3,509,270 | 4/1970 | Dube et al. . |
| 3,541,222 | 11/1970 | Parks et al. . |
| 3,546,775 | 12/1970 | Lalmond et al. . |
| 3,561,110 | 2/1971 | Feulner et al. ............. 174/262 X |
| 3,606,677 | 9/1971 | Ryan . |
| 3,616,532 | 11/1971 | Beck . |
| 3,739,469 | 6/1973 | Dougherty, Jr. . |
| 3,775,844 | 12/1973 | Parks . |
| 3,795,037 | 3/1974 | Luttmer . |
| 3,795,047 | 3/1974 | Abolafia et al. . |
| 3,829,601 | 8/1974 | Jeannotte et al. . |
| 3,859,711 | 1/1975 | McKiddy . |
| 3,862,790 | 1/1975 | Davies et al. . |
| 4,024,629 | 5/1977 | Lemoine et al. . |
| 4,211,603 | 7/1980 | Reed . |
| 4,216,350 | 8/1980 | Reid . |
| 4,249,032 | 2/1981 | Crepeau . |
| 4,249,302 | 2/1981 | Crepeau . |
| 4,383,363 | 5/1983 | Hayakawa et al. . |
| 4,394,712 | 7/1983 | Anthony . |
| 4,452,847 | 6/1984 | Siemon . |
| 4,479,991 | 10/1984 | Thompson . . |
| 4,511,757 | 4/1985 | Ors et al. . |
| 4,642,889 | 2/1987 | Grabbe . |
| 4,712,161 | 12/1987 | Pryor et al. . |
| 4,729,809 | 3/1988 | Dery et al. . |
| 4,740,411 | 4/1988 | Shaheen . |
| 4,755,911 | 7/1988 | Suzuki . |
| 4,788,766 | 12/1988 | Burger et al. . |
| 4,793,814 | 12/1988 | Zifcak et al. . |
| 4,935,584 | 6/1990 | Boggs . |
| 4,954,878 | 3/1990 | Fox et al. . |
| 4,970,106 | 11/1990 | DiStefano et al. ............. 156/902 X |
| 5,089,880 | 2/1992 | Meyer et al. . |
| 5,121,299 | 6/1992 | Frankeny et al. . |
| 5,128,831 | 7/1992 | Fox, III et al. .............. 439/69 X |
| 5,129,142 | 7/1992 | Bindra et al. . |
| 5,140,745 | 8/1992 | McKenzie, Jr. . |
| 5,224,265 | 7/1993 | Dux et al. .................. 29/852 |
| 5,232,598 | 8/1993 | Ehrenber et al. ............. 29/852 X |

FOREIGN PATENT DOCUMENTS

| | | |
|---|---|---|
| 2312172 | 12/1976 | France . |
| 47-19142 | 6/1972 | Japan ........................ 29/830 |
| 2-265296 | 10/1990 | Japan ........................ 29/830 |

OTHER PUBLICATIONS

IBM Technical Disclosure Bulletin, vol. 21, No. 4, Sep. 1978 "Multilayer Laminated Chip Carrier", pp. 1396–1397.

*Primary Examiner*—Carl J. Arbes
*Attorney, Agent, or Firm*—Lerner, David, Littenberg, Krumholz & Mentlik

[57] ABSTRACT

A multi-layer circuit panel assembly is formed by laminating circuit panels with interposers incorporating flowable conductive material at interconnect locations and a flowable dielectric materials at locations other than the interconnect locations. Excess materials are captured in reservoirs such as within vias in the circuit panels and apertures in interior elements within the interposers. The flowable materials of the interposers, together with the reservoirs, allow the interposers to compress and take up tolerances in the components. The flowable dielectric material encapsulates conductors on the surfaces of the circuit panels.

16 Claims, 6 Drawing Sheets

METHOD OF MAKING A MULTI-LAYER CIRCUIT ASSEMBLY

FIELD OF THE INVENTION

The present invention relates to the field of electrical circuitry, and more particularly relates to multi-layer circuit structures such as multi-layer circuit boards, and to components and methods utilized in fabrication of such structures.

BACKGROUND OF THE INVENTION

Electrical components are commonly mounted on circuit panel structures such as circuit boards. Circuit panels ordinarily include a generally flat sheet of a dielectric material with electrical conductors disposed on a major, flat surface of the panel or on both major surfaces. The conductors are commonly formed from metallic materials such as copper and serve to interconnect the electrical components mounted to the board. Where the conductors are disposed on both major surfaces of the panel, the panel may have additional conductors extending through the dielectric layer so as to interconnect the conductors on opposite surfaces. Multi-layer circuit board assemblies have been made heretofore which incorporate plural, stacked circuit boards with additional layers of dielectric materials separating the conductors on mutually facing surfaces of adjacent boards in the stack. These multi-layer assemblies ordinarily incorporate interconnections extending between the conductors on the various circuit boards in the stack as necessary to provide the required electrical interconnections.

Electrical components which can be mounted to circuit panel structures include so-called "discrete" components and integrated circuits which include numerous semiconductor and related components in a single semiconductor chip. Chips of this nature can be mounted on elements commonly referred to as "chip carriers" which are specialized circuit panel structures having very fine patterns of electrical conductors. A chip carrier may be incorporated in a package which is mounted to a larger circuit board and interconnected with the remaining elements of the circuit. Alternatively, the chip can be mounted directly to the same circuit panel which carries other components of the system. This arrangement is ordinarily referred to as a "hybrid circuit". Relatively large circuit panels are commonly made of polymeric materials, typically with reinforcement such as glass, whereas very small circuit panels such as those used as semiconductor chip carriers may be formed from ceramics, silicon or the like.

There have been increasing needs for circuit panel structures which provide high density, complex interconnections. The needs have been particularly acute in the case of circuit panel structures for use as chip carriers or in hybrid circuits, but are also felt in other applications. These needs are addressed by multilayer circuit panel structures. The methods generally used to fabricate multi-layer panel structures have certain serious drawbacks. Multi-layer panels are commonly made by providing individual, dual sided circuit panels with appropriate conductors thereon. The panels are then stacked one atop the other with one or more layers of uncured or partially cured dielectric material, commonly referred to as "prepregs" disposed between each pair of adjacent panels. Where an electrically conductive ground plane is desired between adjacent panels, the same may be formed by a layer of foil disposed between two prepregs, the foil and the prepreg being disposed between adjacent panels in the stack. Such a stack ordinarily is cured under heat and pressure to form a unitary mass. After curing, holes are drilled through the stack at locations where connections between different boards are desired. The resulting holes are then coated or filled with electrically conductive materials, typically by plating the interiors of the holes.

It is difficult to drill holes with a high aspect ratio or ratio of depth to diameter. The drills used to form the holes tend to deviate from a straight path as they pass through the various layers, leading to inaccuracies in placement of the holes. Moreover, there is always some misalignment between the various boards in the stack. Tolerance zones must be provided around the intended location of each hole in each panel to compensate for these factors. Small drills are prone to breakage and hence there is a practical lower limit on hole size. Additional difficulties are encountered in depositing conductive material within small holes of high aspect ratio. For all of these reasons, the holes used in assemblies fabricated according to these methods must be relatively large and hence consume substantial amounts of space in the assembly. Moreover, these holes necessarily extend from the top or bottom of the stack. Therefore, even where interconnections are not required in the top or bottom layers, space must be provided for holes to pass through these layers so as to provide needed interconnections in the middle layers. Accordingly, substantial amounts of the available surface area on the panels must be allocated to the holes and to accommodate the tolerance zones ground the holes. Moreover, the electrical interconnections formed by depositing conductive materials in such drilled holes tend to be weak and susceptible to failures induced by stresses encountered in service, including stresses caused by differential thermal expansion of the dielectric and conductive materials. The drilling method and the general nature of the laminates used therein is described, for example in Doherty, Jr., U.S. Pat. No. 3,793,469; and Guarracini, U.S. Pat. No. 3,316,618. Various alternative approachs have been proposed.

Parks et al., U.S. Pat. No. 3,541,222; Crepeau, U.S. Pat. No. 4,249,032; Luttmer, U.S. Pat. No. 3,795,037; Davies et al., U.S. Pat. No. 3,862,790 and Zifcak, U.S. Pat. No. 4,793,814 all relate generally to structures which have metallic or other conductive elements arranged at relatively closely spaced locations on a dielectric sheet with the conductive elements protruding through the dielectric sheet in both directions. Such a sheet may be sandwiched between a pair of circuit boards and the circuit boards may be clamped or otherwise held together so as to provide mechanical interengagement between conductive elements on the adjacent faces of the circuit boards and the conductive elements of the composite sheet. In each of these arrangements, the conductive elements, the composite sheet or both is resilient or malleable so as to provide for close interengagement between the conductive elements of the composite sheet and the conductors on the circuit boards. Although these arrangements provide interconnections of a fashion without drilling, they suffer from serious drawbacks including the need for extraneous mechanical elements to hold the assembly together, and limited reliability.

Beck, U.S. Pat. No. 3,616,532 describes a variant of this approach in which small coil springs coated with a fusible solder are mounted in insulating boards which are then stacked between printed circuit layers. The assembly is heated so as to melt the solder, thereby freeing the springs to expand into engagement with the conductors on adjacent boards so that the spring and solder cooperatively form an interconnection between the adjacent circuit boards. Dube et al., U.S. Pat. No. 3,509,270 utilizes a similar approach to connection of the two layers on opposite sides of the same circuit board, but in this case the spring may be allowed to expand through a layer of bonding material which holds the conductive layers to the opposite sides of the central board.

Dery et al., U.S. Pat. No. 4,729,809 discloses the use of an anisotropically conductive adhesive material disposed between opposing sublaminates, the adhesive composition having sufficient conductivity across the relatively small spaces between conductors on adjacent layers to form an electrical interconnection therebetween, but having low conductivity across the relatively large spaces between adjacent conductors on the same surface so that it does not produce an unwanted lateral interconnection along one surface. Boggs, U.S. Pat. No. 4,935,584 discloses an approach using multiple sublaminates or sheets, each having conductors on it and each having through holes. These sheets are laminated to one another in such fashion that some of the through holes are aligned with one another and conductive material is introduced into the aligned through holes to form a conductor extending in the vertical direction, between the various vertical levels of the assembly. Lemoine et al., U.S. Pat. No. 4,024,629 illustrates a generally similar approach in a multi-layer assembly of the types made from ceramic materials.

Phohofsky, U.S. Pat. No. 3,214,827 describes a technique in which plural circuit layers are stacked with aperatures in the various layers being aligned, and an interconnecting element is physically advanced into the aligned aperatures to form a vertical interconnect. Parks, U.S. Pat. No. 3,775,844 uses a multi-layer structure with interconnecting wafers some of which provide "z" access or vertical interconnections, the plural wafers in the stack being held together either by pressure or by fusing.

Pryor et al., U.S. Pat. No. 4,712,161 forms a multi-layer ceramic bodied circuit assembly with copper conductors on opposite sides of one element and with an interposer or vertical connector structure having solder or solid wire extending between opposite faces. The conductor bearing and vertical connection structures are stacked one atop the other so that the conductors are engaged with the vertical connections in the vertical connection structures. Each such structure has a layer of a fusible glass on its major surfaces. These structures are stacked and subjected to heat and pressure so that the fusible glass on the surfaces of the abutting structures, apparently with additional fusible glass interposed between these surfaces, fuse to join the entire assembly into a unitary multi-layer device. Jeannotte et al., U.S. Pat. No. 3,829,601 provides a multi-layer structure with the vertical interconnections formed by posts protruding vertically from the surfaces of the various layers, the posts being aligned with one another and bonded to one another by a metallurgical diffused interface. A separate insulating layer is disposed between the circuit bearing layers to insulate these from one another.

Berger et al., U.S. Pat. No. 4,788,766 uses conductor bearing circuit lamina having hollow, eyelet-like via structures, each such structure having a rim protruding vertically from the surrounding structure. Each such via structure is provided with a thin layer of a conductive bonding material. In making the multi-layer structure, dielectric bonding films are interposed between the circuit bearing lamina. The dielectric films have apertures in locations corresponding to the locations of the eyelet structures, in the adjacent circuit bearing lamina. Thus, the upstanding rims of the eyelet structures can bear upon one another when the assembly is forced together under heat and pressure. The layers of conductive bonding material on the rims of the abutting eyelets are said to form bonds between the abutting eyelets structures. The dielectric bonding layer must necessarily be quite thin and the dielectric bonding layer must also have the holes in it at the specific locations required to form the interconnections. Further, each of these holes must be substantially larger than the eyelet rims. The tolerance of this system for deviations from planarity or paralleling, for misalignment between lamina and for misalignment between the lamina and the dielectric bonding films is limited. Moreover, only surface or point bonds are formed between abutting eyelet rims which tends to limit the strength of the vertical interconnections.

Ryan, U.S. Pat. No. 3,606,677 discloses a technique for making a multi-layer circuit board which relies upon controlled viscosity and flow characteristics of an adhesive bonding agent between layers to prevent the adhesive from penetrating into through holes within the layers. Abolafia et al., U.S. Pat. No. 3,795,047 uses circuit bearing laminates have epoxy coated thereon in a pattern corresponding to the pattern of the vertical interconnects. Conductive spherical particles are applied and held on this epoxy and form junctions with opposing layers when multiple layers are pressed together. Reid, U.S. Pat. No. 4,216,350 and Grabbe, U.S. Pat. No. 4,642,889 utilize sheet like interposers having multiple holes extending through them. Such holes are filled or partially filled with solder, with or without additional conductive material such as wire, and the interposer is then disposed between components to be connected and heated so as to form a plurality of soldered joints simultaneously. Bohrer et al., U.S. Pat. No. 3,077,511 utilizes a similar approach for connecting multiple layers of a printed circuit. In this case, the solder bearing interposer includes a dielectric film which apparently remains in place after the solder is fused.

Despite all of these efforts toward manufacture of multi-layer laminar electrical circuits, there have still been needs for further improvements in such circuits and in the materials and components used to manufacture the same.

SUMMARY OF THE INVENTION

One aspect of the present invention provides methods of making multi-layer circuit assemblies. Methods according to this aspect of the invention employ a plurality of circuit panels, each having one or more electrical conductors thereon and each having electrically conductive material at preselected interconnect locations on at least one major surface. The method also utilizes one or more generally sheetlike interposers each having preselected interconnect locations on both major surfaces and electrically conductive elements extending between interconnect locations on opposite surfaces. The interposer has a flowable dielectric material on its major surfaces except at its interconnect locations. At least some of the electrically conductive material on the circuit panels, on the interposers, or both at their respective interconnect locations may be flowable. A method according to this aspect or the invention preferably includes the step of stacking the circuit panels and interposers in superposed relation so that each interposer is disposed between two circuit panels, with the major surfaces of the interposers and circuit panels confronting one another, and with interconnect locations on the confronting surfaces of the circuit panels and interposers being aligned with one another. The method most preferably further includes the step of causing the flowable dielectric material to flow and conform to the major surfaces of the circuit panels. The method desirably includes the step of causing the flowable conductive material to flow and join the conductive material on the circuit panels and on the interposers into continuous electrical conductors extending between adjacent circuit boards at their respective interconnect locations. Most preferably, the flowable dielectric and flowable conductive materials are caused to flow concomitantly with one another in a single step involving application of heat and pressure to the stacked circuit panels and interposers.

The flowable dielectric material on the interposers fills in regularities on the major surfaces of the circuit panels. In particular, where the circuit panels have electrical conductors extending along their major surfaces these often formed as raised strips on the panel surface. The flowable dielectric material fills the spaces between these raised strips, so that each strip is fully surrounded by solid dielectric material after the fabrication procedure. This protects the conductors on the circuit panels from atmospheric effects such as corrosion and also eliminates undesirable electrical effects and structural problems resulting from air voids or pockets adjacent the conductors.

The electrically conductive elements carried by the interposers form parts of the electrical connections between adjacent circuit panels. Most preferably, the conductive elements of each interposer are brought into abutting or juxtaposed relation with the conductive materials of the adjacent circuit panels at each interconnect location before the dielectric material is caused to flow. The use of conductive material on the interposers to form conductive paths between adjacent circuit board allows the use of interposers having substantial thickness.

Each interposer most desirably includes a generally sheetlike interior element and flowable dielectric material on opposite surfaces of such interior element. The interior element desirably is adapted to remain dimensionally stable throughout the process, and hence reinforces the interposers against undesired dimensional changes in directions parallel to the planes of the circuit panels. The interior element may incorporate an electrically conductive structure which serves to define a potential plane such as a ground plane in the finished assembly. The interior element of each interposer may include a porous structure such that flowable dielectric material can be forced into the interior volume of the porous structure when the dielectric material is in its fluid state. Thus, the porous structure can absorb excess flowable dielectric materials. As further discussed below, this allows the interposers to compensate for uneven circuit panel thicknesses and variations in the number of raised conductive strips on different areas of the circuit panels.

A further aspect of the invention provides additional methods of making multi-layer circuit assemblies. Methods according to this aspect of the invention also utilize a plurality of circuit panels each having at least one electrical conductor thereon and each having electrically conductive material at preselected interconnect locations on at least one major surface. Methods according to this aspect of the invention also use at least one generally sheetlike interposer, each incorporating dielectric material and conductive elements extending between interconnect locations on the opposite major surfaces. In these methods as well, the interposers and circuit panels are stacked so that each interposer is disposed between a pair of adjacent circuit panels with the major surfaces of the interposers and circuit panels confronting one another. The stacking step includes the step of aligning the interconnect locations of each interposer surface with the interconnect locations on the confronting circuit panel surface to thereby form sets of aligned interconnect locations, each such set including interconnect locations on two circuit panels and on both surfaces of the interposer disposed therebetween. Thus, each such set of aligned interconnect locations includes the conductive material of one conductive element on the interposer, and the conductive material of one interconnect location on each of the adjacent circuit panels. At least some of the conductive material in each set of aligned interconnect locations is flowable. Methods according to this aspect of the invention preferably include the step of causing the flowable conductive material to flow so as to join the conductive material in each set of aligned interconnect locations into a continuous electrical conductor extending between adjacent circuit panels. Most preferably, methods according to this aspect of the invention include the step of capturing excess flowable electrically conductive material at least some sets of aligned interconnect locations, and preferably at each such set, in at least one reservoir within at least one of the circuit panels or within the interposer.

Most preferably, some of the stacked elements (the circuit panels and the interposers) have hollow, tubular passageways or vias extending into them from their major surfaces at the interconnect locations, and have conductive material disposed in each such via. The other, mating elements preferably have masses of flowable conductive material exposed at their interconnect locations. The space within the vias may provide the reservoirs for capturing excess flowable conductive material. In a particularly preferred arrangement, the vias are provided in the circuit panels, and the conductive material extending into the vias may be in the form of a hollow, tubular metallic shell lining each of the vias. In at least some of these locations, the via, and the conductive material disposed therein may extend entirely through the circuit panel so that the conductive material within the via interconnects conductors on opposite major surfaces of the circuit panel. Where the vias are formed in the circuit panels, the interposers may have holes extending between interconnect locations on opposite major surfaces. A conductive element in the form of a unitary mass of flowable conductive material may be disposed within each such hole. In the assembly process, the conductive material of each such unitary mass may flow into the vias of circuit panels disposed on opposite major surfaces of the interposer, thereby joining the conductive material in both such vias into a unitary electrical conductor.

Because the flowable conductive material at the interconnect locations can be provided in excess, and any excess will be taken up within the reservoirs, the flowable conductive material can assure reliable connections between the circuit panels even where the circuit panels deviate somewhat from precise planarity. Also, the flowable conductive material can form substantial, low resistance, reliable electrical connections even where there is substantial deviation from exact, precise alignment of the interconnection locations on the various circuit panels and interposers.

The most preferred methods according to the invention combine the features of both aspects of the invention discussed above.

Further aspects of the present invention provide interconnection and bonding interposers for making electrical circuit assemblies. Interposers according to this aspect of the invention preferably include a generally lamellar, sheetlike or planar body having a pair of oppositely facing major surfaces and interconnect locations on both major surfaces, there being electrically conductive elements extending through the body between interconnect locations on opposite major surfaces. The body includes a flowable dielectric material distributed over the major surfaces except at the interconnect locations. The flowable dielectric material may be disposed in layers substantially covering each major surface of the body except at the interconnect locations. The body may include an interior element disposed between the major surfaces, such as a sheetlike electrically conductive potential plane element or an apertured, porous element having aperatures adapted to take up the flowable dielectric material when the flowable dielectric material is in its fluid state. The flowable dielectric material may be a material such as a thermosetting polymer, thermoplastic polymer, an unreacted or partially reacted polymer precursor or combinations thereof. The flowable dielectric material desirably is an adhesive material. The conductive elements extending through the body of the interposer desirably include a flowable electrically conductive material, the flowable conductive material being exposed at each major surface of the interposer. The flowable conductive material may be a wholly metallic material such as a solder or else may include a non-metallic material. Interposers according to this aspect of the present invention can be utilized in manufacturing methods as discussed above.

These and other objects, features and advantages of the present invention will be more readily apparent from the detailed description of the preferred embodiment set forth below, taken in conjunction with the accompanying drawings.

BRIEF DESCRIPTION OF THE DRAWINGS

Each of FIGS. 4 and 5 are fragmentary, schematic sectional views on an enlarged scale depicting certain features of the.,embodiment shown in FIGS. 1–3.

DETAILED DESCRIPTION OF THE PREFERRED EMBODIMENTS

Figure 1:
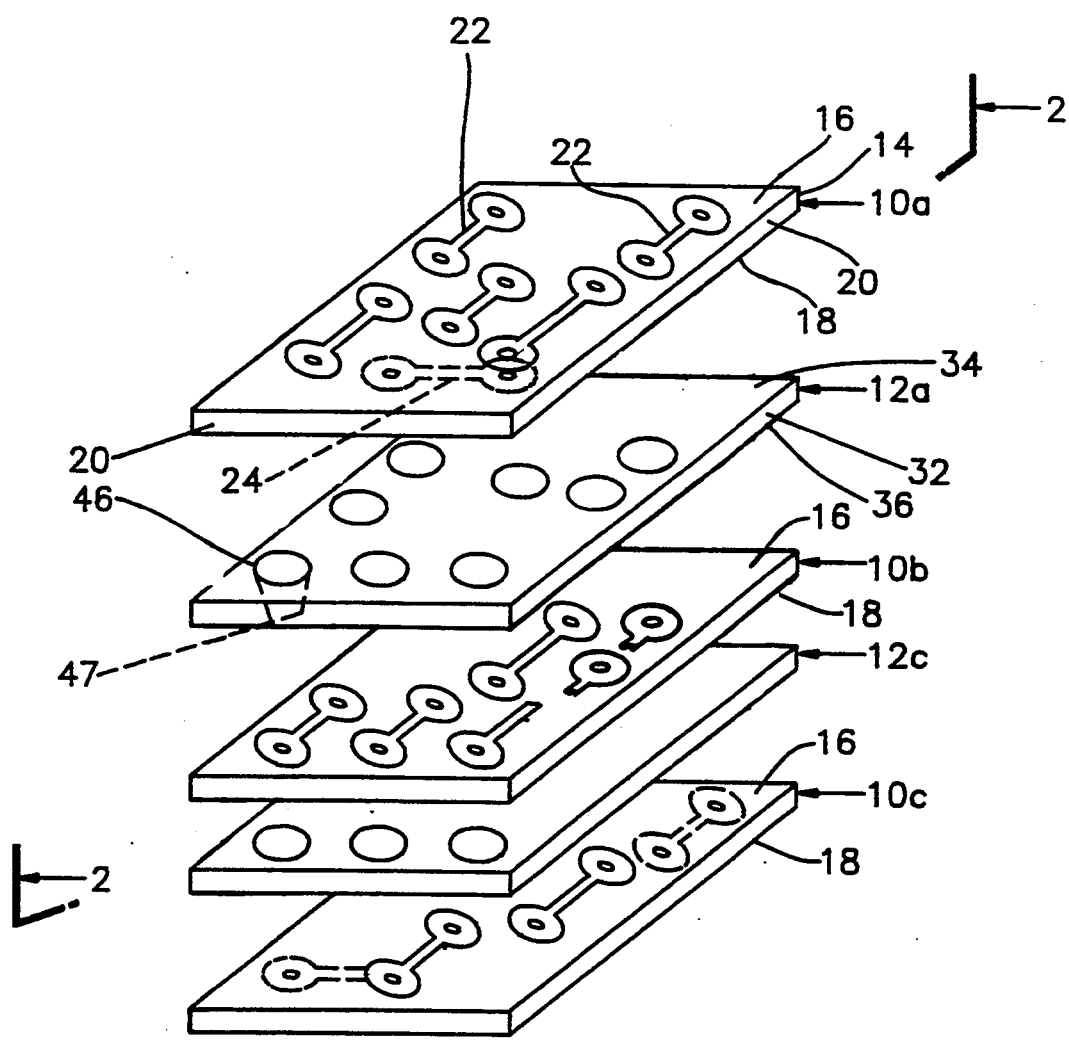
FIG. 1 is a schematic, exploded perspective view showing certain components in one stage of an assembly process according to one embodiment of the invention.
Figure 2:
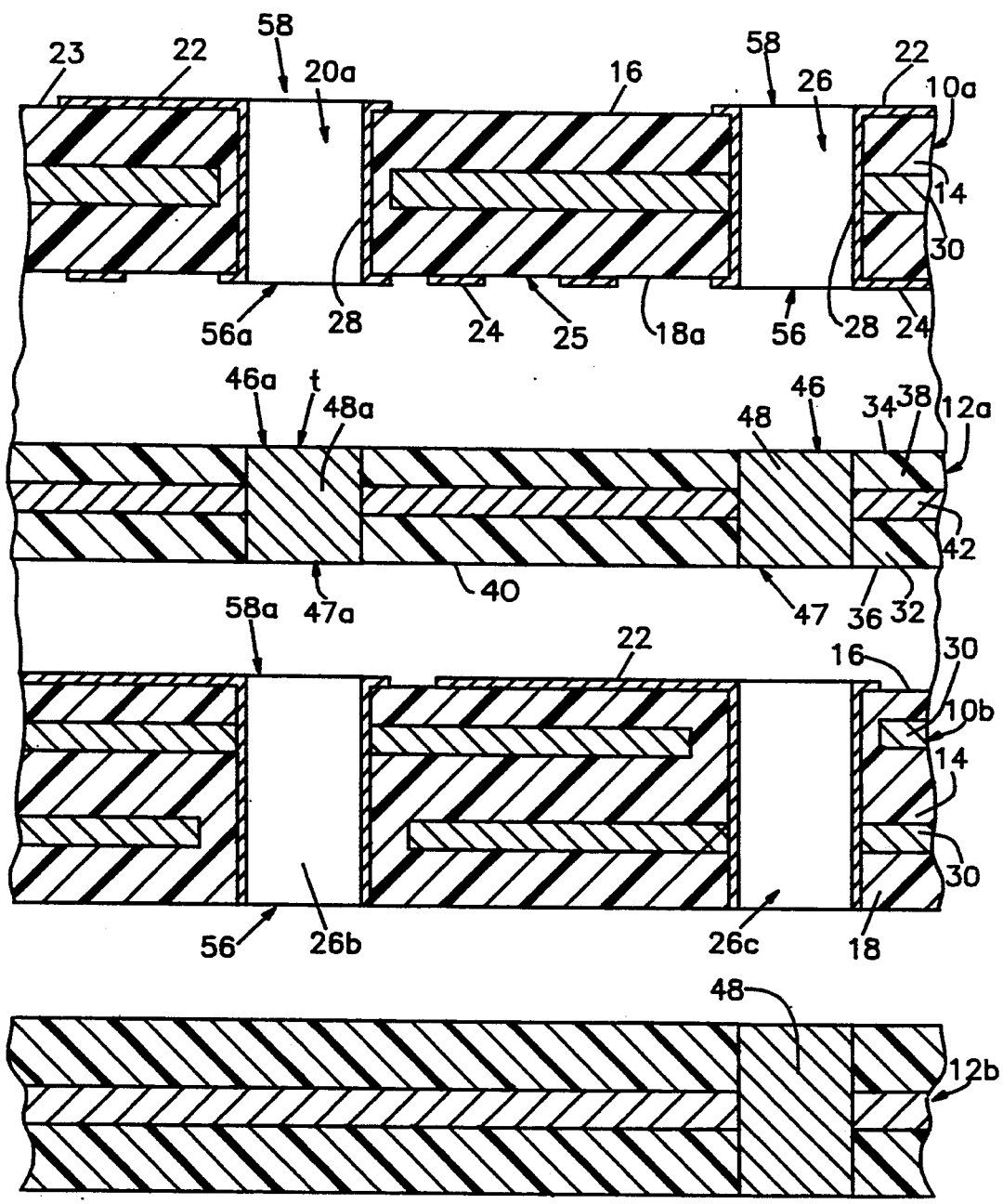
FIG. 2 is a fragmentary, diagrammatic sectional view along 2—2 in FIG. 1.
Figure 3:
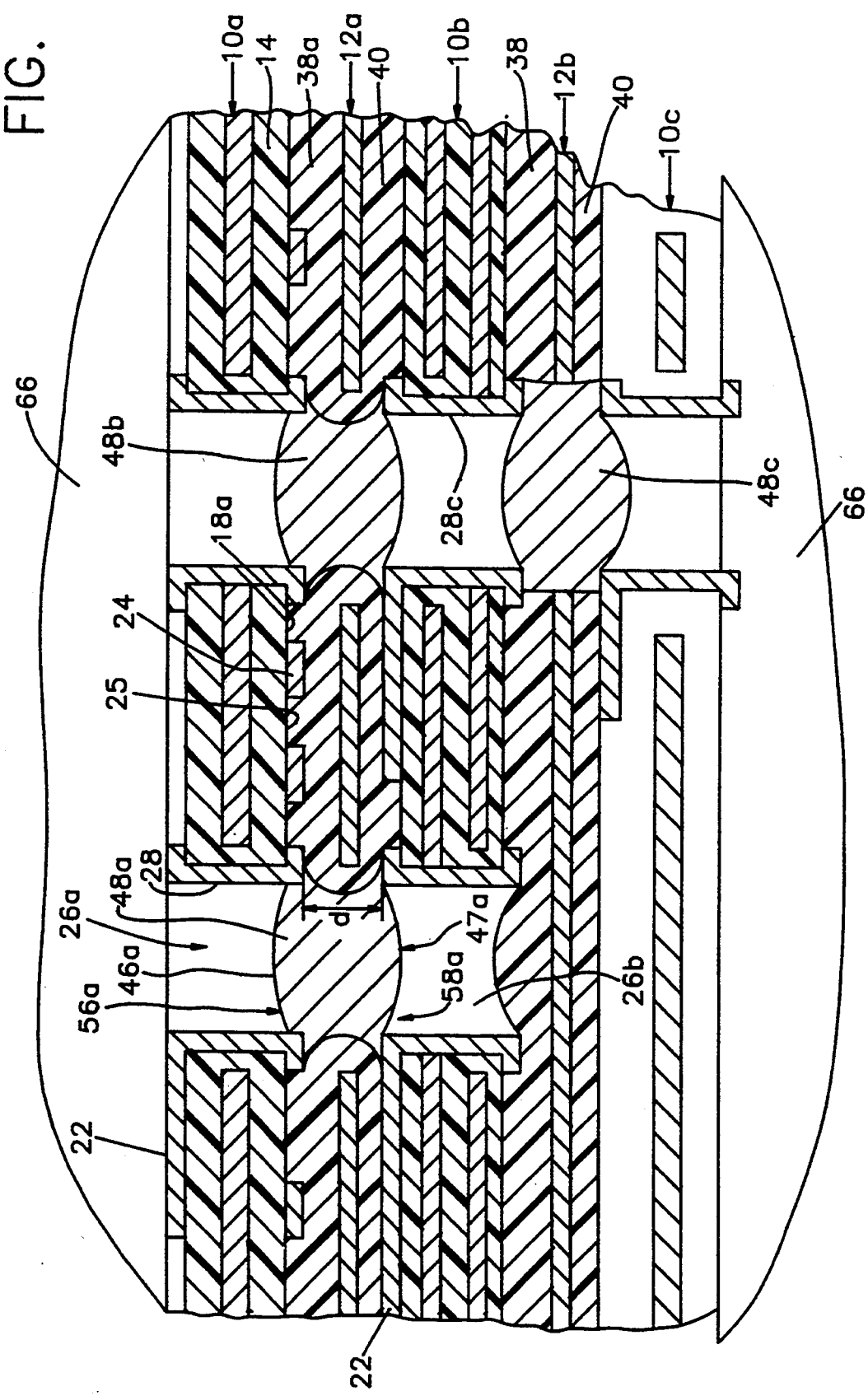
FIG. 3 is a view similar to FIG. 2 but depicting the same components at a later stage in the process.

A method of making multi-layer circuit assemblies in accordance with one embodiment of the present invention utilizes a plurality of circuit panels 10 and interposers 12. Each circuit panel 10 incorporates a body 14 having oppositely directed major surfaces 16 and 18, the area of the major surfaces being substantially greater than the area of the edge surfaces 20 connecting these major surfaces. As used in this disclosure with reference to an object, "lamellar" means that the object is generally sheetlike or platelike. In the embodiment of FIGS. 1—3, the body 14 of each circuit panel is generally lamellar and is also substantially flat, so that the major surfaces 16 and 18 are substantially planar and parallel to one another. Each circuit panel includes electrical conductors 22 on its first or top major surface 16 and also has electrical conductors 24 on its second or bottom surface 18. As best seen in FIG. 2, conductors 22 have finite thickness, so that the exposed surface of each conductor 22, facing away from dielectric body 14 is raised above the surrounding surface 16 of the dielectric body. Thus, conductors 22 define a pattern of raised lands on surface 16, there being depressions 23 between the conductors. Likewise, conductors 24 define a pattern of raised lands on the second surface 18 of each panel 10, with depressions 25 between these raised lands.

Each circuit panel also has vias 26 extending into the panel from interconnect locations 56 and 58 on major surfaces 18 and 16 respectively. As illustrated, vias 26 extend entirely through each circuit panel. Electrically conductive material 28 is disposed within each via 26. The electrically conductive material 28 is in the form of a lining or coating on the interior wall of each via, so that the conductive material 28 within each via forms a hollow tube extending entirely through the circuit panel. Conductive material 28 in certain vias on each circuit panel electrically connects one or more conductors 22 on the first or top surface with one or more conductors 24 on the second or bottom surface of the panels.

Some or all of the circuit panels 10 may include one or more sheetlike electrically conductive potential plane elements 30 disposed within the dielectric body 14 of the circuit panel remote from both major surfaces 16 and 18 of the panel. Each potential plane element 30 may be connected to conductive linings 28 extending through the vias 26 and hence connected to one or more of the conductors 22 and 24 on the circuit panel. Apart from such deliberate interconnections the potential plane elements 30 are isolated from the other conductive elements of the circuit panel.

Circuit panels 14 may incorporate substantially conventional materials of construction normally used for making circuit panels. Thus, the dielectric bodies of circuit panels 14 may be formed from polymeric materials such as thermosetting, thermoplastic or reaction cured polymeric materials or combinations thereof including blends. Among the polymeric materials which can be used are epoxies, phenolics, elastomers, liquid crystal polymers, ketones, sultones, polyimides, epoxy modified polyimides, fluorinated polymers and combinations thereof. The dielectric bodies may incorporate reinforcing materials such as glass, ceramic, aramid or other high elastic modulus materials such as fibers, particles or hollow spheres. Fibrous reinforcements may be provided either dispersed throughout the other dielectric material of the body or as one or more sheets of knit or woven material. The dielectric bodies may also be formed from inorganic materials such as glass, ceramic, glass-ceramic materials and silicon. The electrically conductive materials used for the conductors, for the electrically conductive materials in the vias and for the potential plane elements may be metallic conductive materials such as copper or a copper alloy, aluminum, tungsten, molybdenum, nickel-iron alloys such as those known as Invar, gold, other noble metals and combinations of such metals as alloys or composites. The conductive materials may be provided as layered structures (not shown) incorporating a plating of one metal on another. Alternatively or additionally, the conductive portions of the circuit panels may include intrinsically electrically conductive polymers or mixtures of non-conductive materials such as nonconductive polymers with electrically conductive particles, such as dispersions of fine metal particles in polymers.

The arrangement of conductors 22 and 24 on each circuit panel, and the pattern of electrical connections between conductors on opposite sides of each panel are dictated by the requirements of the circuit to be provided in the finished product. Normally, the different panels used in one assembly will have differing patterns of conductors. Usually, the conductors 22 on one surface of each panel extend predominantly in one direction, whereas the conductors 24 on the opposite surface of the panel extend predominantly in a perpendicular direction. The circuit panels may also include other structures (not shown) for mounting and connecting active electrical elements.

Each interposer 12 used in the assembly process has a generally lamellar body 32 having a first major surface 34 and a second major surface 36 of substantially greater surface area than the edge surfaces of the body. The lamellar bodies may be substantially flat, sheetlike structures. Each body 32 incorporates a first layer 38 of a flowable dielectric material at its first surface 36 and a second layer 40 of flowable dielectric material at its second major surface 36. The term "flowable" as used in this disclosure means that the material is capable of undergoing fluid flow under at least some conditions. The flowable materials need not be in a fluid or liquid state at room temperature. Also, the flowable materials need not be permanently fluid, but need only remain in the fluid condition during parts of the manufacturing process as discussed below. The flowable materials used in these layers may be arranged to solidify or "set" permanently after flow during the manufacturing process. The flowable dielectric material may include one or more polymeric constituents, which may be wholly or partially organic polymers. Among the polymeric constituents which may be employed are uncured or partially cured reactive curing polymer precursors such as partially cured epoxy resins, commonly referred to as "B-stage" expoxies. Other flowable dielectric materials include unset or partially set thermosetting polymers and thermoplastic polymers. The flowable material may be an adhesive material or may incorporate an adhesive material such as a curable adhesive or a hot-melt adhesive as one component. That is, the flowable dielectric materials in layers 38 and 40 should be selected so that these materials will ultimately adhere to the dielectric material disposed on the surfaces of the circuit panels, to the conductive material on such surfaces or both. Such adhesion may occur either upon contact of the flowable dielectric material with the materials of the circuit panels during flow, or upon setting of the flowable material after such contact. Many reactive curing polymer precursors such as uncured or partially cured epoxy are inherently adhesive. Also, many thermoplastic materials will adhere to other materials, after contacting the other materials while the thermoplastics are in a softened or viscous state.

The flowable dielectic material should be substantially free of entrapped gas bubbles, and should also be substantially free of volatile materials. For purposes of the present disclosure, the term "substantially free of volatile materials"0 should be understood as indicating that volatile materials, if any, present in the flowable materials, will not form bubbles at the temperatures required to bring the material to a fluid condition and cure the material when such temperatures are applied under about 125 mm Hg absolute pressure. Gas bubbles or volatile materials which are not entrapped, i.e., which are present at an exposed surface of the flowable material, ordinarily need not be considered as such gas or volatiles normally will dissipate in the early portion of the laminating step without causing bubbles.

The body 32 of each interposer 12 also includes a dimensionally stable sheetlike interior element 42. Interior element 42 is disposed within body 32 remote from major surfaces 34 and 36, and extends generally parallel to these surfaces. As used with referenced to a generally lamellar or sheetlike element, the term "dimensionally stable" refers to dimensional stability in the directions parallel to the major surfaces of such element. Thus, interior element 42 is resistant to deformation in the directions parallel to its major surfaces and parallel to major surfaces 34 and 36 of body 32. However, interior element 42 may be flexible such that the same can be readily bent in directions perpendicular to the major surfaces. Interior element 42 as illustrated is formed from a sheet of a relatively high elastic modulus dielectric material. Normally, the elastic modulus of the material constituting interior element 42 is higher than the elastic modulus of the flowable dielectric materials. Suitable high modulus dielectric materials for the interior element include polyimide, epoxy, crystalline polymers and liquid crystal polymers. Interior element 42 may itself incorporate reinforcing materials such as fibers or filaments either in dispersed or woven sheet form. Among the suitable fibers or filaments are glass and ceramic fibers. Interior element 42 may also be formed from substantially rigid, inflexible dielectric materials such as glass or ceramic.

Each interposer 12 has a plurality of holes extending entirely through the body. Each such hole extends from a first interconnect location 46 at the first surface 34 to a second interconnect location 47 at the second surface 36. As further set forth below, these interconnect locations on each interposer are selected to match the desired patterns of interconnect locations on the particular circuit panels 10 which would be used with such interposer. That pattern in turn is determined by the electrical design requirements of the finished circuit.

A unitary conductive element 48 formed from a flowable electrically conductive material is disposed within each hole of each interposer. Each such conductive element 48 extends entirely through the interposer from one major surface to another and hence incorporates a first portion of flowable conductive material exposed at an interconnect location 46 on the first major surface 34 of the interposer and a second portion of flowable conductive material exposed at an interconnect location 47 on the second major surface 36 of the interposer. Each such exposed conductive portion 50 may be flush with the surrounding portions of the interposer major surface or slightly recessed beneath such surface. More preferably, each exposed conductive portion protrudes slightly above the surrounding portions of the interposer major surface. The flowable dielectric material layers 38 and 40 are interrupted by the holes and by elements 48 so that the flowable conductive material is not present at interconnect locations 46 and 47 of the interposer.

The flowable conductive material utilized in elements 48 may be a metallic alloy of the type commonly used for brazing and inner lead tape automated bonding operations, such as a gold-based flowable alloy. For example, a tin-gold brazing alloy may be employed. Such an alloy may be provided with a gold-rich cover overlying the bulk alloy. Alternatively, the flowable conductive material may incorporate a non-metallic conductive material such as an intrinsically conducting flowable polymer such as a polyacetylene or an intrinsically non-conducting flowable polymer or unreacted or partially reacted polymer precursor such as an epoxy resin, together with a conductive material such as a metallic material dispersed in the non-conducting polymer or polymer precursor. As a further alternative, a solder such as lead-tin solder may be employed. However, as these solders normally require a flux or activator to achieve reasonably good bonds with the conductive elements of the circuit panels, they are less preferred. Although such fluxes and activators can be used, they can generate undesirable "outgassing" during the lamination process, and can leave undesirable residues in the finished assembly. The conducting material is "flowable" in the same sense as discussed above with respect to the dielectric material. That is, the conductive material can be made to flow under appropriate conditions, but need not be in a fluid condition at room temperature. The flowable conductive material desirably is substantially free of gas bubbles and substantially free of volatile materials as well. Also, the flowable conductive material may be arranged to set or harden to a substantially solid condition after flow. The flowable conductive material is also selected so as to form a bond with the conductive material of the circuit panel. This bond need not necessarily involve wetting of the circuit panel conductive materials by the flowable conductive material, but should be such as to provide electrical continuity therebetween.

Interposers in accordance with this embodiment of the invention may be fabricated by co-extruding, laminating or coating a sheet of dimensionally stable, high modulus material suitable for forming the interior element 42 with layers of the flowable dielectric material suitable for forming layers 38 and 40, so as to provide a semi-finished interposer sheet. This coating operation may be performed on a continuous or semi-continuous basis utilizing substantially conventional coating techniques such as calendaring, roll coating, dip coating, spray coating, electrostatic coating, electrophoretic deposition or the like. The semi-finished sheet may then be punched or drilled to form the holes at the interconnect locations. Such punching or drilling may be conducted using mechanical tools such as matched punches and dies, twist drills or the like, or else may be performed using radiant energy techniques such as application of focused laser light. Alternatively, the holes may be formed by chemical etching of dissolution processes. Desirably, each interposer is relatively thin, and hence the aspect ratio or ratio of length to diameter of the holes is relatively low, typically about 3:1 or less and ordinarily about 1:1 or less. Such holes can be readily and accurately formed. Conductive elements 48 may be formed by introducing the flowable conductive material into the holes in fluid state or by providing the flowable conductive material as preformed elements in a substantially rigid condition. For example, the conductive material for forming elements 48 may be provided in the form of a rod or wire and cut to length to form small, disk-like elements 48. Alternatively, elements 48 may be punched from a sheet of conductive material. The flowable conductive material may also be applied by desposition processes such as electrochemical or vacuum deposition, or by printing processes such as silk screen printing. It is not essential that the surfaces of elements 48 be precisely flush with the surrounding surfaces 34 and 36 of the interposer body. Likewise, it is not essential that the flowable conductive elements 48 entirely fill the holes in the interposer body.

The interposers 12 and circuit panels 10 may be assembled with one another in an assembly method according to one embodiment of the invention. Most desirably, the circuit panels and the interposers are inspected before assembly. Each circuit panel should be examined and, desirably, electrically tested prior to assembly with the other elements of the structure. It is a significant advantage of the present methods that the circuit panels can be completely formed, with conductors on both sides where necessary and with conductive connections between conductors on opposite sides before the assembly step, so that all of these elements of each circuit panel can be fully tested before the circuit panel is assembled to other elements. This greatly reduces the expense and waste associated with defects in the circuit panels, and greatly enhances the reliability of the ultimate multi panel assembly. Each circuit panel can be tested by methods conventionally used for testing double sided circuit boards. The interposers likewise can be checked by testing and/or inspection before assembly. The tests performed on the interposer desirably include tests for presence of conductive elements 48 at selected interconnect locations, absence of such conductive elements at other locations and electrical continuity of each conductive element 48, so as to assure that it extends entirely through the interposer. The ability to test the components in advance is particularly useful in the present methods because the lamination steps following after the component tests are high-reliability steps. If the individual circuit panels and interposers are good, the finished assembly almost invariably will be good. This provides a significant advantage over processes which require drilling or other low-reliability operations after assembly of multiple layers.

The prechecked circuit panels and interposers are arranged in a stack as illustrated, in exploded view, in FIG. 1. Thus, the circuit panels 10 and interposers 12 are superposed on one another with their major surfaces confronting one another. The circuit panels and interposers are arranged in alternating, interleaved order so that each interposer is disposed between two circuit panels and hence one interposer is disposed between each pair of adjacent circuit panels in the stack. For example, interposer 12a is disposed between adjacent circuit panels 10a and 10b, whereas interposer 12c is disposed between panels 10b and 10c (FIG. 2). Although the panels and interposers are illustrated with spaces therebetween for clarity of illustration in FIGS. 1 and 2, the major surfaces of the circuit panels and interposers ordinarily abut one another in the stack. The stacking operation is conducted so as to align the interconnect locations on each interposer with interconnect locations on the confronting major surface of the adjacent circuit panel. Interconnect location 46a, and hence the flowable conductive material of conductive element 48a exposed at such interconnect location is aligned with interconnect location 56a of circuit panel 10a whereas interconnect location 58a of circuit panel 10b is aligned with interconnect location 47a on the opposite side of interposer 12a, and hence aligned with the conductive material of element 48a exposed at that location. There is exposed electric conductive material on each circuit panel at each such interconnect location. In the preferred arrangement illustrated the exposed electrically conductive material at each interconnect location on each circuit panel includes the electrically conductive element 28 within a via. For example, via 26a extends inwardly from the lower major surface 18a of circuit panel 10a, and hence the exposed conductive material at interconnect location 56a on surface 18a includes the conductive material of conductive element 28a within via 26a. As will be appreciated, the conductive elements 28 extending through each of the may constitute exposed conductive material at two separate interconnect locations on two opposite sides of the circuit panel.

The desired alignment can be achieved manually or by automatic vision and/or robotic placement systems capable of directly observing the patterns of conductive material on the various elements and aligning the elements accordingly. Alternatively or additionally, the circuit panels and interposers can be provided with features such as guide holes or edges disposed at preselected locations relative to the interconnect locations and these guide holes can be engaged with guide pins or rods.

While the conductive materials of bodies 48 and the dielectric materials of layers 38 and 40 are in a fluid condition, and while the circuit panels and interposers are maintained in alignment, the circuit panels and interposers are forced together, as by squeezing the stacked circuit panels and interposers between a pair of opposed platens 66 (FIG. 3). If necessary to bring the flowable conductive materials of bodies 48 or the flowable dielectric materials of layers 38 and 40 to a fluid state, the interposers and desirably, also the circuit panels may be heated to an elevated temperature either before or during the pressing operation. Thus, the circuit panels and interposers may be a preheated individually prior to stacking, or the entire stack may be heated by applying heat to the platens during the squeezing operation, or both. As the circuit panels and interposers are forced together, the flowable conductive material at the interconnect locations on each surface of each interposer contacts conductive material of the confronting circuit panel at the aligned interconnect location of that circuit panel. For example, the flowable conductive material of body 48a at interconnect location 46a on interposer 12a contacts the conductive, tubular element 28 at the aligned interconnect location 56a of circuit panel 10a. Likewise, flowable conductive material at interconnect location 47a flows into contact with the electrically conductive material at the aligned interconnect location 58a of circuit panel 10b. The electrically conductive materials join with the conductive materials of the circuit panels to form a continuous electrically conductive path. Preferably, the flowable conductive material bonds to the other conductive material. Because the flowable conductive material at each interconnect location on one surface of each interposer is already electrically connected to flowable conductive material on the opposite surface of the same interposer, this forms a continuous conductive path extending between the interconnect locations of adjacent circuit panels. For example, the flowable conductive material of body 48a, including conductive material at locations 46a and 47a on opposite sides of the interposer joins with the conductive material of circuit panels 10a and 10b at interconnect locations 56a and 58a of each such circuit panel to form a continuous electrical conductor extending between the conductive materials of the two circuit panels. This serves to interconnect the conductors 22 and 24 on each circuit panel with conductors on other circuit panels.

The flowable dielectric materials 38 and 40 on the surfaces of the interposers flow into intimate contact with the confronting surfaces of the adjacent circuit panels, and fill depressions between conductors on those surfaces. For example, the flowable dielectric material of layer 38a on interposer 12a flows to fill the spaces 25 between conductors 24 on surface 18a of circuit panel 10a. The flowable dielectric material most preferably bonds to the dielectric bodies of the circuit panels and desirably also to the surface conductors on the circuit panels. Thus, after such flow, each conductor is entirely surrounded by the dielectric material of the panel bodies 14 and by the flowable dielectric materials. This encepsulation of the conductors on the circuit panels is achieved even though the circuit panels do not include a flowable dielectric material at their major surfaces.

After the flowable conductive materials and flowable dielectric materials have been allowed to flow in this fashion, the flowable materials are set or brought to a substantially solid condition. Flowable materials such as metallic solders and thermoplastic materials preferably are set simply by allowing the stack to cool. Reactive materials such as epoxies and other polymer precursors may be set by allowing the reaction to proceed. The completed assembly is then ready for use. Electrical components such as semiconductor chips or discrete devices can be mounted to exposed surfaces of the top and/or bottom circuit panels 10a and 10c and the electrically connected to the conductors 22 and 24 on those panels. The panel assembly may also be coated, on the exposed surfaces of the top and bottom panels, with a flowable dielectric material to protect the exposed conductors on those surfaces. Because the conductors on the interior circuit panel surfaces, abutting an interposer 12 are fully encapsulated within the dielectric material of the interposer and the confronting dielectric material 14 of the circuit panel bodies, these conductors are inherently protected from corrosion or other deteriorating effects of the atmosphere. Likewise, because these interior conductors are fully surrounded by solid dielectric material of known and predictable electrical properties, the unpredictable electrical effects caused by air voids in the immediate vicinity of a conductor are eliminated.

Several features of the process combine to provide extremely high reliability. Some of the flowable conductive material at each set of aligned, confronting interconnect locations penetrates into the spaces 26 defined in the vias of the circuit panels. The spaces of the vias thus act as reservoirs to take up any excess flowable conductive material which may be present at that particular set of interconnect locations. This serves to absorb variations in distances between adjacent circuit panels at the various interconnect locations. If the surfaces of circuit panels or interposers are not precisely planar, or are not parallel with one another, some portions of a particular circuit panel may engage the conductive material of the interposer before others during the assembly process. However, because the conductive material of the interposer is flowable, and because it can flow into the spaces within the reservoirs at the interconnect locations, the conductive material of the interposer at these first-contacted locations will yield and allow the panel to move towards the interposer, thus allowing the conductive material of the interposer to contact the conductive material at other interconnect locations on the same panel. Also, because the conductive material of the interposer can flow into the reservoirs defined in the circuit panels, the flowable conductive material can make reliable contact over the substantial area of conductive material defined by the interior conductive lining 28 of each reservoir.

The flowable dielectric materials of the interposers can achieve reliable, full surface contacts with the surfaces of the circuit panels even where the circuit panels surfaces are irregular or deviate substantially from exact planarity and parallelism. Flow of the dielectric materials compensates for any such deviation. Some of the flowable dielectric material may be forced into space previously occupied by flowable conductive material and/or into some or all of the reservoirs defined on the circuit panels. As best seen in FIG. 3, some of the flowable dielectric material of layers 38 and 40 on interposer 12a has bulged into space originally occupied by flowable conductive material 48a. Also, where a via space or reservoir 56 of a circuit panel confronts a portion of an interposer which is not provided with conductive material, some of the flowable dielectric material can penetrate into that via space. For example, some of the flowable dielectric materials of layer 38 on interposer 12b adjacent the bottom of the stack in FIG. 3 is shown as penetrating into the space 26b in circuit panel 10b.

Figure 5:
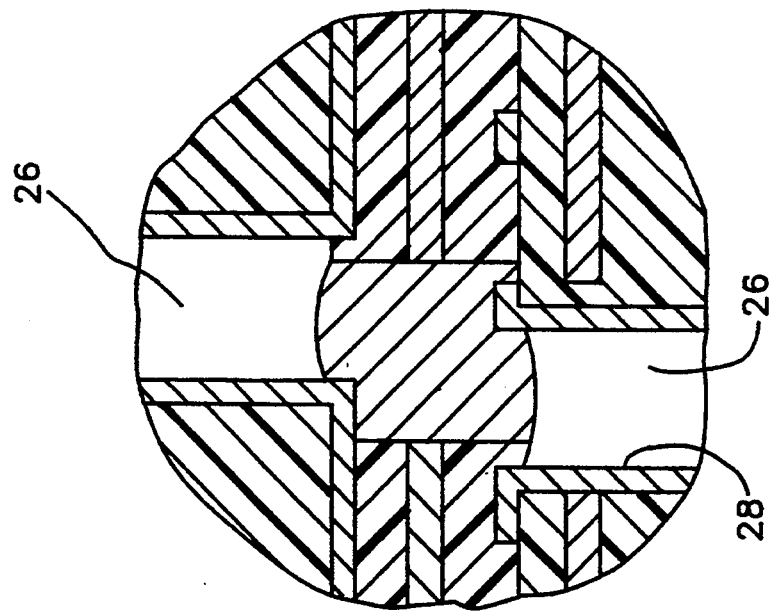
Figure 4:
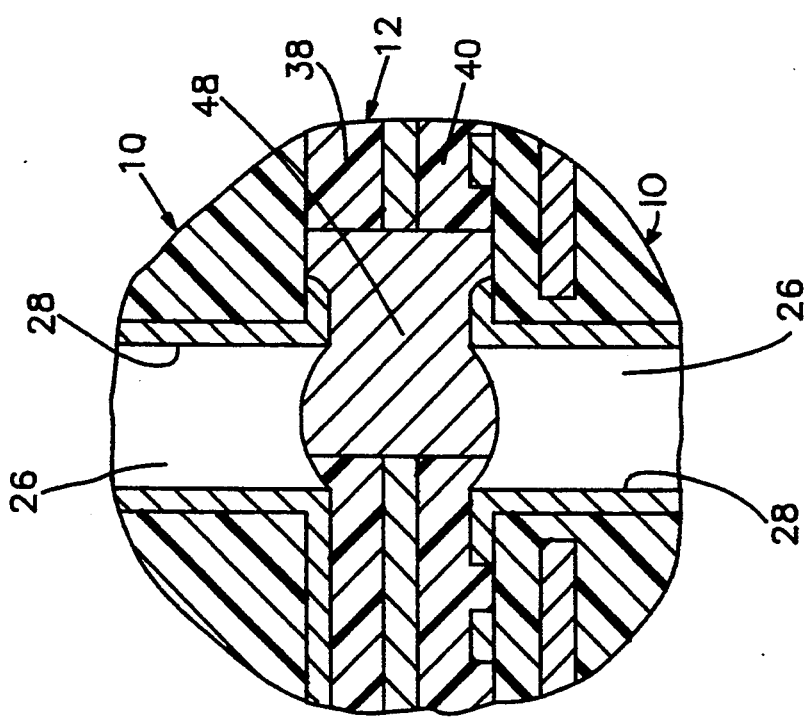

The process is also relatively insensitive to deviations from perfect alignment between the interconnect locations on the various elements. As illustrated in FIG. 4, the interconnect locations on interposer 12 may be misaligned relative to the adjacent circuit panels in directions parallel to the major surfaces of the interposer and panels. Provided that such misalignment amounts to less than the full diameter of one reservoir or via hole 26, the flowable conductive material 48 of the adjacent interposer will still make contact with the conductive material 28 at the interconnect locations of the adjacent circuit panels. Because the dielectric material 38 and 40 on the surfaces of each interposer 12 is flowable, the dielectric material will not hold the circuit panel away from the conductive material of the interposer. Rather, both the dielectric material and the conductive material will penetrate into reservoirs or spaces 26. Likewise, as illustrated in FIG. 5, the circuit panels on opposite sides of a particular interposer can be misaligned with that interposer and within one another to a considerable degree but will still be reliably interconnected by the conductive material of the interposer. Here again, the dielectric material of the interposer does not interfere with the connection. Any excess dielectric material, along with any excess conductive material is simply forced into the reservoirs or spaces 26.

The ability to tolerate such misalignment is particularly important with circuit panels having very small dimensions. As the dimensions, such as the diameter and distance between adjacent vias of the circuit panels diminish, the tolerances encountered in fabrication and alignment of the circuit panels and interposers amount to progressively larger percentages of the dimensions themselves. Nonetheless, because the degree of misalignment which can be tolerated is equal to the full diameter of a via 26, substantial misalignments can be tolerated even with very small via diameters and very close spacing between adjacent vias. This aspect of the present invention is particularly important in fabrication of small, densely packed circuit assemblies the type used with semiconductor chips. Particularly preferred circuit panel assemblies incorporate circuit panels with the vias less than about 0.5 mm in diameter, and more preferably less than about 0.25 mm in diameter, spaced at intervals of about 1.0 mm or less and more preferably 0.5 mm or less.

Figure 6:
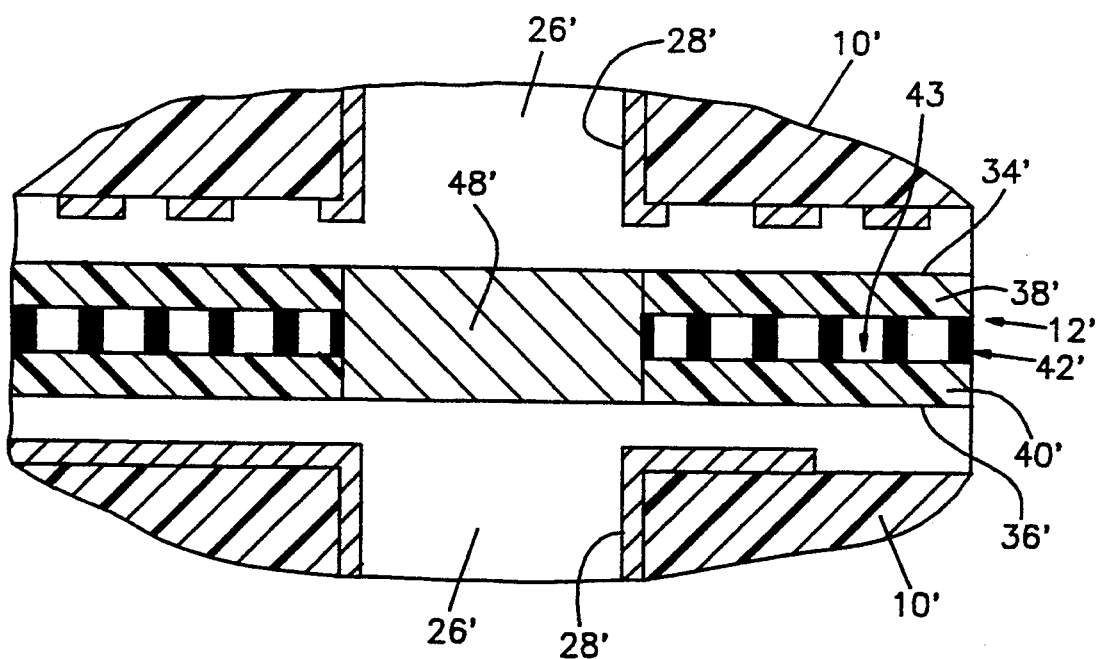
FIG. 6 is a fragmentary diagrammatic sectional view depicting components according to a further embodiment of the invention at one stage in an assembly.
Figure 7:
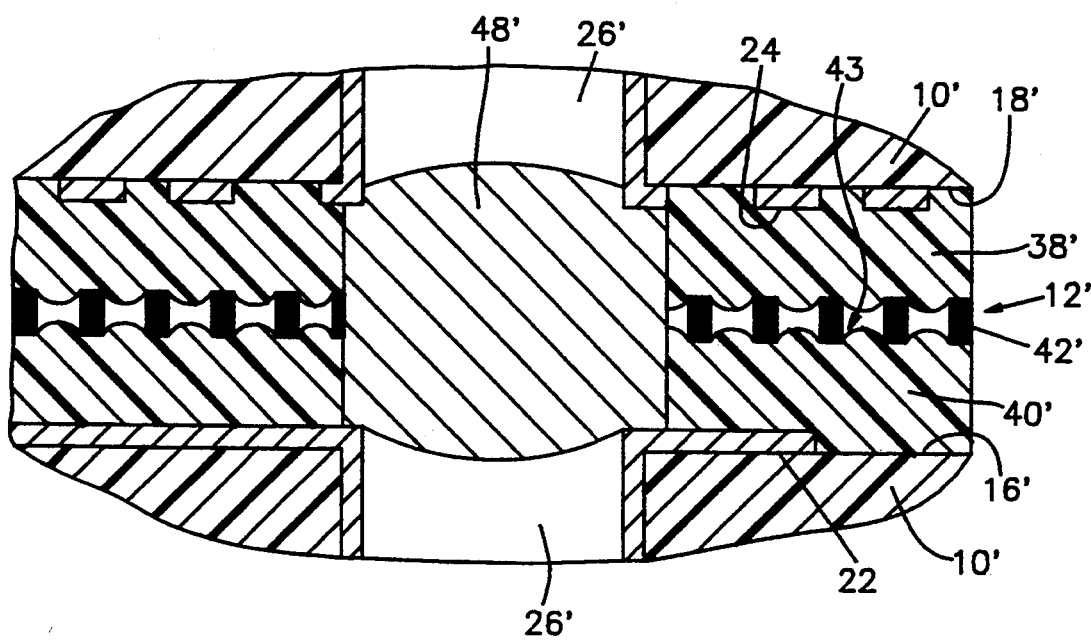
FIG. 7 is a view similar to FIG. 6 but depicting the components at a later stage in the manufacturing process.

As illustrated in FIGS. 6 and 7, an interposer 12' in accordance with an alternate embodiment of the invention includes an interior element 42' having aperatures or perforations 43 extending inwardly from its major surfaces. Layer 38' and 40' of flowable dielectric material extend over opposite major surfaces of interior element 42' and hence define the major surfaces 34' and 36' of the interposer, except at the interconnect locations where flowable conductive material 48' is exposed at the major surfaces of the interposer.

Interior element 42' may be made from the same materials as discussed above with reference to the interior element of the interposers. Apertures 43 preferably are separated from one another by webs of the interior element material, so that the interior element retains substantial strength and dimensional stability despite the presence of the apertures. Flowable conductive material layers 38' and 40' may be applied on the surfaces of interior element 42' by any convenient process. However, the application process should not be such as to completely fill apertures 43 with the flowable dielectric material during manufacture of the interposer. Thus, prior to the assembly process, apertures 43 should have appreciable space within them unoccupied by the flowable dielectric material.

As best seen in FIG. 7, an interposer 12' is utilized in a process, substantially the same as that discussed above. As discussed above, when the flowable conductive materials 48' and the flowable dielectric materials 38' and 40' are in a fluid condition, the stacked circuit panels and interposers are squeezed between opposed platens so as force adjacent circuit panels 10' towards one another and thus compress interposer 12' therebetween. Here again, some of the flowable conductive material 48' on the interposer flows into a reservoir space 26' at each interconnect location. Here also, the dielectric material on each major surface of each interposer flows into intimate contact with the confronting surfaces of the circuit panels 10', and fills spaces between conductors on the surfaces of the circuit panels. The unfilled apertures 43 in the interior elements 42' serve as additional reservoirs for accepting flowable dielectric material. Thus, some of the flowable dielectric material of layers 38' and 40' is forced into these aperatures as the circuit panels 10' are forced towards one another. This permits substantial compression of the interposers to occur during the laminating process, and markedly increases the ability of the system to provide reliable performance even where the circuit panel surfaces 16' and 18' deviate substantially from exact planarity. Moreover, the aperatures provide additional compensation for uneven conductor densities on different portions of the circuit panel surfaces. Flow of the dielectric material 38' and 40' into apertures 43' compensates for the volume occupied by conductors 22 and 24 on the surfaces of the circuit panels. The flowable dielectric material displaced by these conductors can flow into the unfilled aperatures and need not flow laterally, parallel to the circuit panel surfaces.

Figure 8:
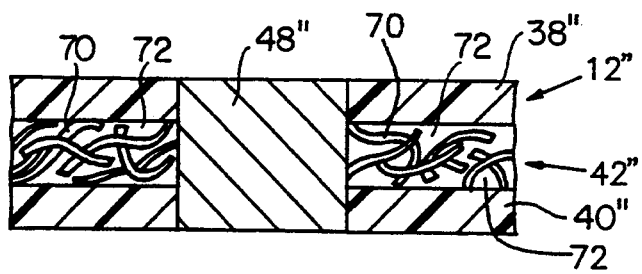
FIG. 8 is a fragmentary diagrammatic sectional view of a component in accordance with a further embodiment of the invention.

An interposer 12" in accordance with yet another embodiment of the invention is illustrated in FIG. 8. This interposer incorporates an interior element 42" formed from a fibrous material 42" including fibers 70. The fibers 70 cooperatively define interior spaces 72, which function in the manner as the discrete apertures 43 of the embodiment discussed above with reference to FIGS. 6 and 7. Masses of flowable conductive material 48" extend through holes in flowable dielectric layers 38" and 40", and in fibrous interior element 42". In a variant of this approach, (not shown) holes may be formed in the flowable dielectric layers 38" and 40", as by laser-ablating these layers selectively after they are assembled with interior element 42". The masses of flowable conductive material may be provided as separate masses positioned in these holes, so that the separate masses are disposed on opposite sides of the interior element. During the lamination process, the flowable conductive material may penetrate through the interior element from opposite sides thereof, so that the flowable conductive material forms unitary massas extending entirely through the interposer. In a further variant, the flowable conductive material may be allowed to flow through the interior element and thus form the unitary mass before the laminating process. In yet another variant, the masses of flowable conductive material may be deposited on the interior element, and the flowable dielectric material layers may be selectively deposited on the regions surrounding the conductive material. In arrangements such as that shown in FIG. 8 and in the above-described variants, the unfilled spaces within the interior element may serve as a reservoir to take up the flowable conductive material during the lamination process.

Interior elements incorporating unfilled spaces, such as the discrete aperatures 43 of FIG. 6 and 7 or the inter-fiber apertures 72 of FIG. 8 should be arranged to permit flow of the flowable dielectric material into the aperatures when the dielectric material is in its fluid state, but to provide appreciable resistance to such flow. This will assure that, when the stacked interposers and circuit panels are forced together, the flowable dielectric material reaches appreciable pressure and hence penetrates into the spaces between conductors and other irregularities on the circuit panel surfaces before the flowable dielectric completely fills the aperatures in the interior element. Stated another way, the resistance to flow of the dielectric material into the apertures should be at least about equal to the resistance to flow of the dielectric material into the spaces between conductors on the circuit panel surfaces. Thus, the dimensions of the aperture openings at the boundary between the flowable dielectric material layers and the interior elements desirably are not greater than the distances between adjacent conductors on the surfaces of the circuit panels. Smaller aperture openings provide still greater resistance to flow into the spaces within the interior element.

Figure 9:
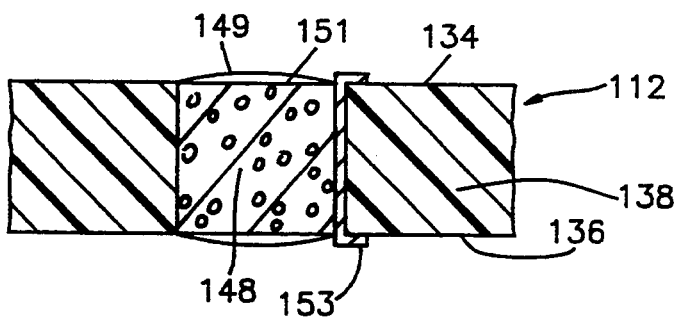
FIGS. 9 and 10 are views similar to FIG. 8 but depicting components in accordance with other embodiments of the invention.

The interposer 112 illustrated in FIG. 9 has no interior element but instead has a solid body of flowable dielectric material providing flowable dielectric material at both major surfaces 134 and 136. In lamination processes which use interposers having no interior elements, the temperature and pressure conditions should be closely controlled so that the flowable dielectric material of body 138 at surfaces 134 and 136 becomes fluid enough to penetrate into spaces between conductors on the circuit panels, but so that gross flow of the dielectric material does not sweep the conductive elements of the interposer out of position. Thus, the flowable conductive materials should be brought to a paste-like or viscous state.

The interposer illustrated in FIG. 9 also has conductive elements incorporating a composite flowable conductive material 148 formed from a dispersion of electrically conductive particles 149 in an electrically nonconductive polymeric matrix 151. Although this composite material is electrically conductive, its conductivity is lower than that of a pure metal and therefore the electrical resistance through the entire body 148 is relatively high. To provide low resistance conductive pathways between adjacent circuit panels, a strip-like metallic conductor 153 extends substantially the entire thickness of interposer 112, from adjacent the upper or first surface 134 to adjacent the lower or second surface 136, this conductor being in contact with the composite flowable conductive material 148. When this flowable conductive material makes contact with the conductive material of circuit panels on opposite sides of the interposer, the conductive materials of the circuit panels will be disposed in proximity to metallic conductors 153. At each interconnect location, the conductive material of the circuit panel will be connected to the metallic conductor 153 of the interposer by only a short, low-resistance path through the composite flowable conductive material.

Figure 10:
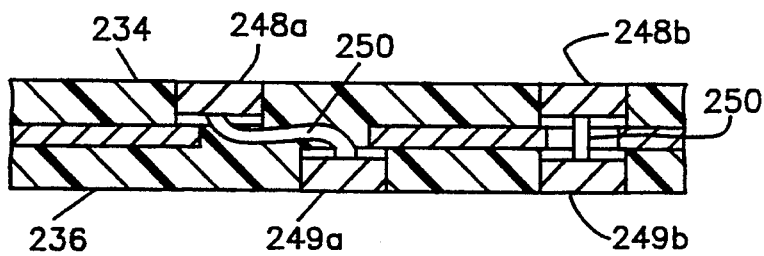

The interposer illustrated in FIG. 10 differs from those discussed above in that the flowable conductive elements are not unitary bodies of flowable conductive material extending entirely through the interposer. Rather, each conductive element includes a discrete mass 248 of flowable electrically conductive material on one major surface of the interposer, a separate mass of flowable electrically conductive material 249 at the opposite major surface and a non-flowable electrical conductor 250 extending through the interposer, between these two masses 248 and 149. Also, in the interposer of FIG. 10, some of the interconnect locations on opposite surfaces of the interposer are offset from the electrically connected interconnect locations on the opposite side. For example, the interconnect location defined by mass 248a on major surface 234 is offset from the electrically connected mass and interconnect location 249a on surface 236. This arrangement can be used where the interconnect locations on adjacent circuit panel surfaces are offset from one another.

Figure 11:
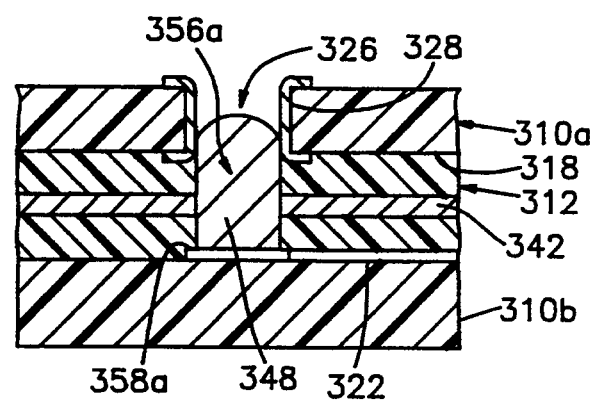
FIG. 11 is a further fragmentary diagrammatic sectional view depicting components according to yet another embodiment of the invention.

As illustrated in FIG. 11, an assembly using an interposer 312 having a mass of flowable conductive material 348 extending entirely through the interposer need not have reservoirs in all of the circuit panels. Thus, circuit panel 310b does not have a via hole or reservoir at interconnect location 358a. Rather, that interconnect location has only a flat plate or disk of conductive material connected to a electrical conductor 322 on the surface of the circuit panel. However, interconnect location 356a on the surface 318 of panel 310a has a reservoir 326 open to surface 318 as well as conductive material in the form or a via liner 328 at the interconnect location. Reservoir 326 accepts excess conductive materials from the body or mass 348 of conductive material in interposer 312 during the assembly process. Because body 348 of flowable conductive material is entirely in a fluid state during the assembly process, reservoir 326 is effectively in fluid communication with interconnect location 358a, on the opposite side of interposer 312 as well as with interconnect location 356a. Any excess flowable conductive material which may be present at interconnect location 358 can pass upwardly, towards interconnect location 356, so that reservoir 326 effectively takes up excess conductive material for both interconnect locations.

The interior element 342 of interposer 312 is metallic, so that the same can be used as a ground plane or other potential plane in the finished circuit assembly. Interior element 342 thus is arranged to contact some, but not all, of the masses 348 of flowable conductive material so as to provide electrical connections to the potential plane. In the finished circuit, interior element 342 is electrically connected through the circuit panel conductors which are electrically connected to the flowable conductive masses. The remaining flowable conductive masses (not shown) are electrically isolated from the conductive interior element 342 by dielectric material surrounding such flowable conductive masses.

Figure 12:
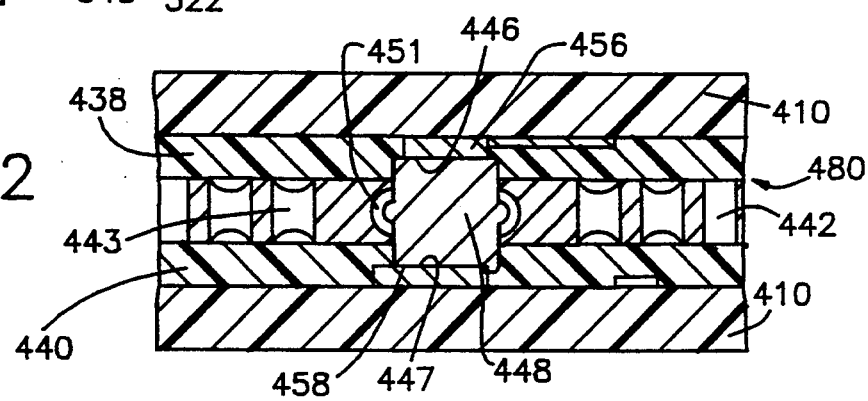
FIG. 12 is a view similar to FIG. 11 but depicting components according to another embodiment.

In the arrangement shown in FIG. 12, the circuit panels 410 do not have reservoirs at their respective interconnect locations 456 and 458. The interposer 480 has masses of flowable conductive material 448 extending entirely through the interposer between interconnect locations 446 and 447 on opposite sides of the interposer. The interior element 442 of the interposer defines reservoirs 451 open to each such mass 448, as well as apertures 443 open to the flowable dielectric material layers 438 and 440. During the laminating process, excess flowable conductive material from masses 448 may be forced into reservoirs 451 as the circuit panels 410 brought together, in much the same way as excess flowable dielectric material from layers 438 and 440 is forced into apertures 443. Thus, each reservoir 451 is in fluid communication with aligned, confronting interconnect locations 446 and 456, and with the aligned, confronting interconnect locations 458 and 447, so that reservoir 451 can take up excess flowable conductive material from each such pair of aligned, confronting interconnect locations.

As will be readily appreciated, numerous further variations and combinations of the features discussed above can be utilized. Merely by way of example, the overall scheme illustrated in FIGS. 1–5 can be reversed so as to provide the circuit panels with masses of flowable conductive material and to provide reservoirs in the form of conductive, tubular elements extending through the interposers. Also, the number of circuit panels and interposers used in assemblies according to the invention can be as many or as few as desired, although normally at least two circuit panels and at least one interposer would be utilized. The lamellar components can be curved as well as flat. The circuit panels disposed at the extremities of the stack need not be lamellar. The surfaces of such an extreme circuit panel which do not confront an interposer may have any desired configuration. For example, the topmost or bottommost circuit panel may be formed as part of a housing or other component having projections, walls or the like on the side facing away from the stack, or on the stack-facing side outside of the region which overlies the stack. Likewise, regions of the interior circuit panels and/or of the interposers which project laterally out of the stack and do not confront another element in the stack, may be non-lamellar. The alignment and lamination processes discussed above can be modified to operate on a continuous or semi-continuous basis. Thus, the circuit panels and interposers can be provided in the form of continuous ribbons or tapes, and the lamination process can be performed using continuous lamination equipment such as nip rollers or the like. Conversely, it is not essential that all of the components of an individual interposer be secured together prior to stacking with the circuit panels. For example, each interposer could be formed by layers of flowable materials and an interior layer as discussed above which are stacked in position concomitantly with stacking of the circuit panels. In yet another modification, the lamination procedures can be performed stepwise, as by stacking two or more circuit panels with appropriate interposers and forming the same into a subassembly as discussed above, and then stacking that subassembly with one or more additional circuit panels and interposers, or with a further subassembly and an interposer, and laminating this larger stack to form a larger assembly. As these and other variations and combinations of the features described above can be utilized without departing from the invention as defined by the present claims, the foregoing description of the preferred embodiments should be taken by way of illustration rather than by way of limitation of the invention as claimed.

What is claimed is:

1. A method of making a multi-layer circuit assembly comprising the steps of:
   (a) stacking elements including a plurality of circuit panels having electrical conductors thereon and at least one generally lamellar interposer so that one said interposer is disposed between each pair of adjacent circuit panels and so that major surfaces of said interposers confront major surfaces of said circuit panels, so that preselected interconnect locations on the major surfaces of each said interposer are aligned with interconnect locations on the confronting major surfaces of adjacent circuit panels, and so that electrically conductive material carried on said circuit panels abuts electrically conductive material on said interposer at each set of aligned interconnect locations, at least some of the conductive material at each set of aligned interconnect locations being flowable;

(b) causing said flowable conductive material to flow and join said conductive material on said circuit panels and said interposer into continuous electrical conductors extending between adjacent circuit panels at said aligned interconnect locations; and (c) capturing flowable electrically conductive material at each set of aligned interconnect locations in at least one reservoir within at least one of said elements, at least one said element including a flowable dielectric material extending over at least one major surface, the method further comprising the step of causing said flowable dielectric material to flow into intimate contact with an immediately adjacent major surface of one of said elements concomitantly with the step of causing said conductive material to flow, so that said flowable dielectric materials fills irregularities on such surface of said element, at least some of said flowable dielectric material being captured in said reservoirs along with said flowable conductive material.

2. A method as claimed in claim 1 wherein at least one of said elements has hollow vias extending into it from at least one major surface thereof at the interconnect locations, said stacking step including the step of placing said flowable conductive material in alignment with said vias, said steps of capturing flowable conductive material and flowable dielectric material including the steps of capturing flowable conductive material and flowable dielectric material in said vias.

3. A method as claimed in claim 2 wherein at least one of said circuit panels has said vias extending into it from at least one major surface thereof and at least one of said interposers has said flowable conductive material exposed at least one major surface thereof.

4. A method as claimed in claim 3 wherein each said interposer has said flowable electrically conductive material exposed at said interconnect locations on two oppositely-directed major surfaces, and each said circuit panel has vias extending into at least one major surface thereof, said stacking step including the step of placing the flowable material on both sides of each said interposer sheet into abutment with vias of said circuit panels.

5. A method as claimed in claim 4 wherein each said interposer has holes extending through it between its major surfaces and bodies of said flowable conductive material disposed within said holes so that each such body of conductive material extends to both of said major surfaces of the interposer.

6. A method as claimed in claim 3 wherein at least one of said circuit panels has said vias extending into it from two oppositely-directed major surfaces.

7. A method as claimed in claim 3 wherein the electrical conductors on at least one of said circuit panels including conductive elements extending into said vias, said flowable conductive material contacting said conductor portions in said vias.

8. A method as claimed in claim 7 wherein the conductive elements on at least one of said circuit panels include hollow conductive liners disposed within said vias and wherein said flowable conductive material flows into said tubular conductive liners.

9. A method as claimed in claim 1 wherein said steps of causing said dielectric material to flow and causing said conductive material to flow include the step of applying pressure to said stacked circuit panels and interposers.

10. A method as claimed in claim 1 wherein said steps of causing said dielectric material to flow and causing said conductive material to flow include the step of applying heat to said stacked circuit panels and interposers.

11. A method as claimed in claim 1 wherein said steps of causing said flowable conductive and dielectric materials to flow includes the step of compressing said stacked elements so as to force adjacent circuit panels toward one another and compress each said interposer between the adjacent circuit boards.

12. A method of making a multi-layer circuit assembly comprising the steps of:

(a) stacking a plurality of circuit panels and at least one generally lamellar interposer so that each said interposer is disposed between two adjacent circuit panels and so that major surfaces of two adjacent circuit panels, so that preselected interconnect locations on each said interposer are aligned with interconnect locations on the confronting circuit panel surfaces, so that flowable dielectric material on the major surfaces of each said interposer abuts the confronting circuit panel surfaces except at said interconnect locations, and so that electrically conductive material carried on said circuit panels abuts electrically conductive material on said interposer at said aligned interconnect locations, at least some of said electrically conductive material being flowable;

(b) causing said flowable dielectric material to flow and conform to the major surfaces of said circuit panels so that said flowable dielectric material substantially fills irregularities on the major surfaces of said circuit panels; and (c) causing said flowable conductive material to flow and join said conductive material on said circuit panels and said interposer into continuous electrical conductors extending between said circuit panels;

each said interposer including a generally sheet-like interior element and said flowable dielectric material on opposite surfaces of such interior element, each said interior element having apertures, flowable dielectric material of each said interposer penetrating into such apertures during said step of causing said dielectric material to flow.

13. A method as claimed in claim 12 wherein each said interior element includes an electrically conductive potential plane element, whereby said flowable dielectric material is interposed between said circuit panels and said potential plane element.

14. A method as claimed in claim 12 further comprising the step of setting said flowable dielectric material so that said-set flowable dielectric material secures said circuit panels and said interposer to one another.

15. A method of making a multi-layer circuit assembly comprising the steps of:

(a) stacking a plurality of circuit panels and at least one generally lamellar interposer so that each said interposer is disposed between two adjacent circuit panels and so that major surfaces of each said interposer confront major surfaces of two adjacent circuit panels so that preselected interconnect locations on each said interposer are aligned with interconnect locations on the confronting circuit panel surfaces, so that flowable dielectric material on the major surfaces of each said interposer abuts the confronting circuit panel surfaces except at said interconnect locations, and so that electrically conductive material carried on said circuit panels abuts electrically conductive material on said interposer at said aligned interconnect locations, at least some of said electrically conductive material being flowable;

(b) causing said flowable dielectric material to flow and conform to the major surfaces of said circuit panels so that said flowable dielectric material substantially fills irregularities on the major surfaces of said circuit panels; and (c) concomitantly with step (b) causing said flowable conductive material to flow and join said conductive material on said circuit panels and said interposer into continuous electrical conductors extending between said circuit panels, at least one of said circuit panels having raised electrical conductors extending along at least one of its major surfaces and depressions between said raised conductors, said flowable dielectric material substantially filling said depressions.

16. A method as claimed in claim 15 wherein each said interposer includes a generally sheet-like interior element having an electrically conductive potential plane element, each said interposer also including said flowable dielectric material on opposite surfaces of said interior element, whereby said flowable dielectric material is interposed between said circuit panels and said potential plane element.

* * * * *

UNITED STATES PATENT AND TRADEMARK OFFICE
CERTIFICATE OF CORRECTION

PATENT NO. : 5,367,764
DATED : November 29, 1994
INVENTOR(S) : DiStefano et al

It is certified that error appears in the above-indentified patent and that said Letters Patent is hereby corrected as shown below:

On title page, item [57] Abstract, line 4, after the word "and" delete "a"

Column 2, line 43, "approachs" should read -- approaches --.

Column 7, line 63, after "along" insert the word -- line --.

Column 7, line 68, after "features of the" delete the period and comma.

Column 10, line 31, after "materials" delete the 0.

Column 10, line 46, change "referenced" to read -- reference --.

Column 13, line 45, after "each of the" insert the word -- panels --.

Column 14, line 52, change "encepsulation" to read -- encapsulation --.

UNITED STATES PATENT AND TRADEMARK OFFICE
CERTIFICATE OF CORRECTION

PATENT NO.   : 5,367,764
DATED        : November 29, 1994
INVENTOR(S)  : Di Stefano et al Page 2 of 2

It is certified that error appears in the above-indentified patent and that said Letters Patent is hereby corrected as shown below:

Column 17, line 24, change "aperatures" to read -- apertures --.

Column 17, line 53, change "massas" to read -- masses --.

Column 19, line 20, change "to a electrical" to read -- to an electrical --.

Column 19, line 24, change "form or" to read -- form of --.

Column 22, line 59, change "said-set" to read -- said set --.

Signed and Sealed this

Twenty-fifth Day of April, 1995

Attest:

BRUCE LEHMAN

Attesting Officer

Commissioner of Patents and Trademarks